United States Patent [19]
Gilbert

[11] Patent Number: 6,084,472
[45] Date of Patent: Jul. 4, 2000

[54] MULTI-TANH TRIPLET WITH OPTIMAL BIASING

[75] Inventor: Barrie Gilbert, Portland, Oreg.

[73] Assignee: Analog Devices, Inc., Norwood, Mass.

[21] Appl. No.: 09/015,614

[22] Filed: Jan. 29, 1998

Related U.S. Application Data

[60] Provisional application No. 60/069,488, Dec. 15, 1997.

[51] Int. Cl.[7] .................................................. H03F 3/45
[52] U.S. Cl. ........................................... 330/254; 327/359
[58] Field of Search ................................... 327/346, 356, 327/359; 330/254, 257, 261

[56] References Cited

U.S. PATENT DOCUMENTS

| | | | |
|---|---|---|---|
| 4,965,528 | 10/1990 | Okanobu | 330/252 |
| 5,006,818 | 4/1991 | Koyama et al. | 330/261 |
| 5,079,515 | 1/1992 | Tanimoto | 330/256 |
| 5,389,893 | 2/1995 | Itri et al. | 330/254 |
| 5,420,538 | 5/1995 | Brown | 330/252 |
| 5,572,166 | 11/1996 | Gilbert | 330/254 |
| 5,826,182 | 10/1998 | Gilbert | 327/359 X |
| 5,880,631 | 3/1999 | Sahota | 330/254 X |

OTHER PUBLICATIONS

Gilbert, Barrie; "Design Considerations for BJT Active Mixers Rev. 3.0"; Jun. 18, 1995; pp. 62–76.

*Primary Examiner*—Steven J. Mottola
*Attorney, Agent, or Firm*—Marger Johnson & McCollom, P.C.

[57] ABSTRACT

A biasing scheme for a multi-tanh amplifier improves the dynamic range of the amplifier by utilizing emitter degeneration resistors to reduce uncorrelated noise contributed by current source transistors used to bias the multi-tanh core. The current source transistors form part of a current mirror which can be coupled to a linear-in-dB cell through another current mirror to provide linear-in-dB gain control. An optimal version of the biasing scheme for a multi-tanh triplet minimizes noise at high gain while maximizing linearity and input signal range at low gain by varying both the absolute and relative magnitudes of the bias currents for the triplet core, thereby varying the shape of the transconductance function. The variable bias currents are provided by a multiple output current mirror in which the emitter of the center mirror transistor is connected directly to power supply ground, while the outer mirror transistors include degeneration resistors in their emitter paths. The bias current to the center pair is varied exponentially in response to linear changes in a control signal so as to provide linear-in-dB gain control. The bias currents to the outer differential pairs are increased to a lesser extent than the center pair due to the back emf across the degeneration resistors, and thus, the outer pairs are effectively debiased at high gain, thereby eliminating their contribution to the noise of the amplifier. At low gain, the back emf across the degeneration resistors is negligible, so the linearity of the triplet is maximized to handle large input signals.

7 Claims, 12 Drawing Sheets

| A | K | $G_{RIPPLE}$ (dB) | $V_{RANGE}$ (mVP) | $V_{NOISE}$ (nV/√Hz) | $V_{1dB}$ (dBV) |
|---|---|---|---|---|---|
| 9  | 2/3  | 0.08 | 32.5 | 1.286 | −19.38 |
| 11 | 7/10 | 0.06 | 50.0 | 1.331 | −18.54 |
| 13 | 3/4  | 0.09 | 57.5 | 1.359 | −18.11 |
| 15 | 7/9  | 0.17 | 65.0 | 1.384 | −17.73 |
| 17 | 4/5  | 0.26 | 72.5 | 1.405 | −17.44 |
| 19 | 9/11 | 0.37 | 78.0 | 1.422 | −17.22 |
| 21 | 5/6  | 0.48 | 84.0 | 1.434 | −17.05 |

FIG.10

| $I_G$ (μAP) | $I_{BAIS}$ (mAP) | GAIN (dB) | $V_{NOISE}$ (nV/√Hz) | $V_{1dB}$ (dB) | $IH_3$ (dBV) |
|---|---|---|---|---|---|
| 0   | 2.054 | 30.00 | 0.811 | −27.15 | −13.63 |
| 40  | 1.143 | 23.91 | 1.215 | −26.16 | −12.90 |
| 80  | 0.649 | 17.95 | 1.833 | −24.51 | −11.85 |
| 120 | 0.366 | 12.04 | 2.761 | −21.88 | −10.43 |
| 160 | 0.201 | 6.08  | 4.127 | −19.56 | −8.67 |
| 200 | 0.106 | −0.01 | 6.102 | −18.35 | −6.72 |
| 240 | 0.053 | −6.28 | 8.953 | −17.73 | −4.83 |

FIG.11

MULTI-TANH TRIPLET WITH OPTIMAL BIASING

This application claims priority from U.S. Provisional Patent Application No. 60/069,488, filed Dec. 15, 1997 titled "Hybrid Multi-Tanh Doublet" which is incorporated herein by reference.

BACKGROUND OF THE INVENTION

1. Field of the Invention

This invention relates generally to transconductance cells, and more particularly to variable gain multi-tanh transconductance cells having optimal biasing.

2. Description of the Related Art

Multi-tanh Triplet Core

The output current of a differential pair of common-emitter bipolar junction transistors (BJTs) has a hyperbolic tangent (tanh) response to the input voltage applied between the base terminals. If the input base voltage of a differential pair of BJTs is offset, the tanh function is offset along the input voltage axis. Bipolar transistor cells which combine a number of offset tanh functions from a number of differential pairs of transistors are known as "multi-tanh" cells. By using at least two pairs of transistors, each having a different base offset voltage, a multi-tanh cell splits the individual transconductance ($g_m$) functions of the differential pairs so that the overall transconductance of the composite cell, achieved by summing the individual current outputs in-phase, is more nearly linear, thereby allowing the cell to handle larger voltage swings at its input.

FIG. 1 is a schematic diagram of a prior art multi-tanh cell using three differential pairs of transistors Q1–Q2, Q3–Q4 and Q5–Q6. (The left pair Q1–Q2 and the right pair Q5–Q6 are also referred to as the "outer" pairs, and the center pair Q3–Q4 is also referred to as the "inner" pair.) This cell is also referred to as a "multi-tanh triplet". The center pair Q3–Q4 has no input base voltage offset. The input base voltage of the left pair Q1–Q2 is offset from that of the center pair in one direction, while the input base voltage of the right pair Q5–Q6 is offset in the other direction. The three differential pairs of transistors form a multi-tanh triplet core. The left and right pairs are each biased by a current source that supplies a bias current (or "tail current") of $I_T$, while the center pair is biased by a current source that supplies a bias current of $KI_T$, where K is generally less than one.

FIG. 2 is a graph showing the individual transconductances of the left, center and right differential pairs ("$g_{m1}$", "$g_{m2}$", and "$g_{m3}$", respectively), as well as the overall transconductance ("sum") as a function of input voltage $V_{IN}$ for the multi-tanh triplet of FIG. 1 with optimized parameters. The peaks of $g_{m1}$ and $g_{m3}$ are offset along the input voltage (horizontal) axis from the peak of $g_{m2}$ by $-V_{OS}$ and $+V_{OS}$, respectively, by an integral design feature. As shown in FIG. 2, the overall transconductance is nearly linear over a much wider range of input voltages than any of the individual differential pairs. Thus, the dynamic range of the triplet is much larger than that of the individual differential pairs, while the overall transconductance remains a linear function of $I_T$.

In the circuit shown in FIG. 1, the offset is introduced by fabricating transistors Q2–Q5 with a first emitter area "e" and transistors Q1 and Q6 with a second emitter area "Ae" which is "A" times the emitter area of transistors Q2 and Q5.

The emitter areas of Q3 and Q4 are equal, though they may differ from that of Q1 and Q6. A general value of "Be" is shown in FIG. 1. The offset voltages are given by the following equation:

$$V_{OS} = \pm V_T \ln A \quad \text{(Eq. 1)}$$

where $V_{OS}$ is the offset voltage, $V_T$ is the thermal voltage (~26 mV at 300K), and A is the emitter area ratio.

Linear-in dB Biasing

Indicated generally at 10 in FIG. 3 is another prior art multi-tanh triplet cell much like that disclosed in U.S. Pat. No. 5,572,166 which is herein incorporated by reference. The circuit of FIG. 3 includes a multi-tanh triplet core having three differential pairs of transistors Q1–Q2, Q3–Q4 and Q5–Q6 which are identical to those of FIG. 1 and are, therefore, indicated with the same reference designators. (The same reference designators will be used herein to indicate components that perform the same or similar function.) The circuit of FIG. 3, however, includes a significantly different bias circuit 12 which includes transistors QA–QE, resistors $R_B$ and $R_G$, and current sources CSA and CSB.

The bias circuit 12 provides variable transconductance, and hence, variable gain, to the multi-tanh triplet core. The bias circuit varies the absolute values of the bias currents $I_{C1}$, $I_{C2}$, and $I_{C3}$ in response to changes in the gain control current $I_G$. However, the same ratio N/N', which is similar to the factor K in FIG. 1, is maintained between the inner and outer bias currents. This causes the entire sum curve (net $g_m$ function) to move up and down the vertical ($g_m$) axis, while the shape of the $g_m$ function remains essentially the same, thereby providing the same linear $g_m$ function. The bias circuit 12 varies the bias currents exponentially in response to linear changes in the control current and, therefore, provides "linear-in-dB" gain control.

More detailed consideration will now be given to the structure of the circuit 10 of FIG. 3. The multi-tanh triplet core includes first, second, and third differential pairs of NPN BJTs Q1–Q2, Q3–Q4 and Q5–Q6, respectively. The bases of transistors Q1, Q3 and Q5 are all connected together and to a first input terminal 20 for receiving the first end of a differential input signal. The collectors of transistors Q1, Q3 and Q5 are all connected together and to a first output terminal 24 for providing the first end of a differential output signal. The emitters of Q1, Q3 and Q5 are connected to nodes N1, N2 and N3, respectively.

The bases of transistors Q2, Q4 and Q6 are all connected together and to a second input terminal for receiving the second end of the differential input signal. The collectors of transistors Q2, Q4 and Q6 are all connected together and to a second output terminal 24 for providing the second end of the differential output signal. The emitters of Q2, Q4 and Q6 are connected to nodes N1, N2 and N3, respectively.

Transistors Q2 and Q5 have emitter areas of "e," while transistors Q1, and Q6 have emitter areas of "Ae", and transistors Q3 and Q4 have equal emitter areas of "Be", where A and B are the emitter area ratios.

The bias circuit 12 is a multiple current source and includes three NPN mirror transistors QA, QB and QC which receive a bias voltage signal from a bias voltage generator formed by NPN transistors QD and QE, resistors $R_B$ and $R_G$, and current sources CSA and CSB. The collectors of QA, QB and QC are connected to nodes N1, N2 and N3, respectively, to provide bias currents $I_{C1}$, $I_{C2}$ and $I_{C3}$ to the first, second and third differential pairs, respectively. The emitters of QA, QB and QC are all connected directly to the ground terminal GND, while the bases of QA, QB and QC are connected together and to terminal 28 to receive the bias voltage signal $V_{BIAS}$. This bias cell, together with the multi-tanh triplet, comprise a variable gain cell having a "linear-in-dB" gain law.

Transistor QE of the bias voltage generator has an emitter connected to GND, a collector connected to a current source CSA to receive a primary current signal $I_P$ that is preferably proportional to absolute temperature (PTAT) and a base connected to one terminal of a resistor $R_G$. The other terminal of $R_G$ is connected to the $V_{BIAS}$ terminal 28. A resistor $R_B$ is connected between terminal 28 and GND. NPN transistor QD has a collector connected to a power supply terminal 30 to receive a power supply signal VCC, a base connected to the collector of QE, and an emitter connected to terminal 28. A second current source CSB is connected to the base of QE to provide a gain control PTAT current signal $I_G$ thereto.

Transistor QE has a unit emitter area of "e". The emitter area of QB is N times e, and the emitter areas of QA and QC are both N' times e. Transistor QD is preferably an NMOS transistor so as to eliminate the error in the collector current of QE caused by the base current of QD.

More detailed consideration will now be given to the operation of the circuit 10 of FIG. 3. The primary current $I_P$ from current source CSA is absorbed at the collector of QE which, aided by QD, forms a multiple output current mirror with transistors QA, QB and QC. The gain control current $I_G$, which is applied to the base of QE, flows first in $R_G$, generating a voltage $V_G=I_G R_G$, and is then absorbed in $R_B$, incidentally lowering the current in QD to $V_{BE}/R_{B-IG}$. It follows that $R_B$ must be chosen to support the maximum $I_G$ at the highest temperature. In the absence of $R_G$, the collector current of QB would be $NI_P$ due to the emitter area ratios of QB and QE. However, the voltage drop $V_G=I_G R_G$ reduces the collector current of QB in the following simple exponential manner:

$$I_{C2}=NI_P \exp(-I_G R_G/V_T) \qquad \text{(Eq. 2)}$$

Since the bias current $I_{C2}$ varies exponentially in response to variations in $I_G$, the transconductance of the center differential pair Q3–Q4 likewise varies exponentially with changes in the gain control signal $I_G$. In accordance with Eq. 2, the gain decreases by 1 dB for each increase of 2.976 mVP in $V_G$, since exp(2.976/25.85) changes $I_{C2}$ by a factor of 1.122 (1dB). Thus, the gain of an amplifier, mixer, modulator or other circuit element realized using this invention, varies in a manner which may be described as "linear-in-dB".

Therefore, the operation of the circuit of FIG. 3 is similar to that of FIG. 1, except that the entire $g_m$ curve moves up and down along the vertical ($g_m$) axis as the gain control current $I_G$ is varied. However, the shape of the $g_m$ function remains essentially the same.

N and N' are chosen to establish the relative magnitudes of the bias current signals $I_{C1}$, $I_{C2}$ and $I_{C3}$ to meet the maximum linearity criteria resulting in an optimum triplet transconductance function. The bias current $I_{C2}$ is essentially equal to $I_{C1}$ times N/N', while the bias currents $I_{C1}$ and $I_{C3}$ are essentially equal to each other. The factor N/N' (or "K") is selected in conjunction with the emitter area ratio A to optimize the transconductance curve for maximum linearity. A typical optimum value of (using integer or low-order integer fractions for robust manufacture) is K=¾ when A=13. FIG. 9 is a table showing some other optimum values for A and K along with accompanying performance parameters.

An advantage of the circuit of FIG. 3 is that it provides variable gain while maintaining good linearity in the large-signal transconductance function. Another advantage is that the linear-in-dB gain characteristic is readily adaptable to use in automatic gain control (AGC) systems. The reduction in bias current, hence gain, with increasing $I_G$ is consistent with the general requirements of AGC systems and results in $I_G$ being directly proportional the decibel value of an input signal, as needed to provide the Received Signal Strength Indicator function (RSSI).

Although the prior art circuits of FIGS. 1 and 3 are very useful due to their extended dynamic range, they suffer from several disadvantages. First, to reduce the Johnson noise of the circuit, physically large transistors must be used for Q2–Q5 so as to lower the base resistances. However, even larger transistors would be required for Q1 and Q6 just to maintain the area ratio A. These transistors would take up excessive chip space, have needlessly low rbb', exhibit excessive parasitic capacitance, and have a low transition frequency ($f_T$).

Yet another problem with the circuits of FIGS. 1 and 3 is that, in a practical embodiment, current sources CS1, CS2, and CS3 contribute additional noise to the outer tail currents $I_T$, and this noise appears at the output of the cell.

Furthermore, circuit designers are continuously seeking new techniques for improving the operation of variable-gain amplifiers, mixers and modulators, as well as other applications for such cells, as the performance requirements for modern electronic systems become more demanding.

Accordingly, a need remains for a multi-tanh transconductance cell which overcomes the problems described above.

SUMMARY OF THE INVENTION

Therefore, it is an object of the present invention to improve the performance and utility of multi-tanh transconductance cells.

Another object of the present invention is to reduce the noise of a multi-tanh cell.

A further object of the present invention is reduce the circuit area required for implementing a multi-tanh cell on an integrated circuit.

To accomplish these and other objects, a biasing scheme for a multi-tanh amplifier in accordance with the present invention improves the dynamic range of the amplifier by utilizing emitter degeneration resistors to reduce uncorrelated noise contributed by current source transistors used to bias the multi-tanh core. The current source transistors form part of a current mirror which can be coupled to a linear-in-dB cell through another current mirror to provide linear-in-dB gain control.

In a preferred embodiment, an optimal version of the biasing scheme minimizes noise at high gain while maximizing linearity and input signal range at low gain by varying both the absolute and relative magnitudes of the bias currents for the triplet core, thereby varying both the magnitude and shape of the transconductance ($g_m$) function. The variable bias currents are provided by a special type of current mirror having multiple outputs in which the emitter of the center current source transistor is connected directly to power supply ground, while the outer current source transistors include degeneration resistors in their emitter paths. The bias current to the center pair varies exponentially in response to linear changes in a control signal so as to provide linear-in-dB gain control. The bias currents to the outer differential pairs are increased to a lesser extent than the center pair due to the back emf developed across the degeneration resistors, and thus the outer pairs are effectively debiased at high gain, thereby eliminating their contribution to the noise of the amplifier. At low gain, the back emf across the degeneration resistors is negligible, so the linearity of the triplet is maximized to handle large input signal.

One aspect of the present invention is a method for biasing a multi-tanh core having a plurality of differential pairs of transistors, each pair of transistors being biased by one of a plurality of bias currents, the method comprising varying the relative magnitude of at least two of the bias currents, that is, altering the ratio of the currents, thereby varying the shape of the transconductance function of the core. The absolute magnitude of all of the bias currents can also be varied, thereby shifting the transconductance function of the core along the transconductance axis. The magnitude of the bias currents can be varied exponentially responsive to linear variations in a gain control signal, thereby providing linear-in-dB gain control to the multi-tanh core.

Another aspect of the present invention is a multi-tanh cell comprising: a multi-tanh core having a plurality of differential pairs of transistors; and a bias circuit coupled to the multi-tanh core for providing a plurality of bias currents and arranged so that each of the bias currents biases one of the differential pairs of transistors; wherein the bias circuit varies the magnitude of a first one of the bias currents relative to at least a second one of the bias currents, thereby varying the shape of the transconductance function of the core.

In a triplet, the multi-tanh core includes a first differential pair of transistors coupled to a first node for receiving a first bias current, a second differential pair of transistors coupled to a second node for receiving a second bias current, and a third differential pair of transistors coupled to a third node for receiving a third bias current; and the bias circuit includes: a first bias transistor coupled to the first node for providing the first bias current responsive to a bias voltage; a second bias transistor coupled to the second node for providing the second bias current responsive to the bias voltage; a third bias transistor coupled to the third node for providing the third bias current responsive to the bias signal; and a bias voltage generator coupled to the first, second, and third bias transistors for generating the bias voltage responsive to a control signal. In an optimal embodiment, the first and third bias transistor have emitter degeneration resistors.

An advantage of the present invention is that it provides variable gain operation that achieves very low noise at high gain while maintaining good large-signal linearity in the transconductance function at low gain. Another advantage is that it provides a linear-in-dB gain characteristic which is readily desirable in automatic gain control systems.

Another advantage of the present invention is that it reduces the size of the outer pairs of transistors required for a multi-tanh core.

A further advantage of the present invention is that it reduces the amount of supply-voltage headroom required for low noise operation.

Yet another advantage of the present invention is that it increases the dynamic range of a multi-tanh cell, measured as the ratio of the input-referred 1dB gain-compression point at low gain to the input-referred noise at high gain.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 10 is a table showing some optimum values of the parameters of the circuit of FIG. 1.

FIG. 11 is a table summarizing the performance of the circuit of FIG. 6 at various values of $I_G$.

DETAILED DESCRIPTION

Degenerated Current Source Transistors

Figure 3:
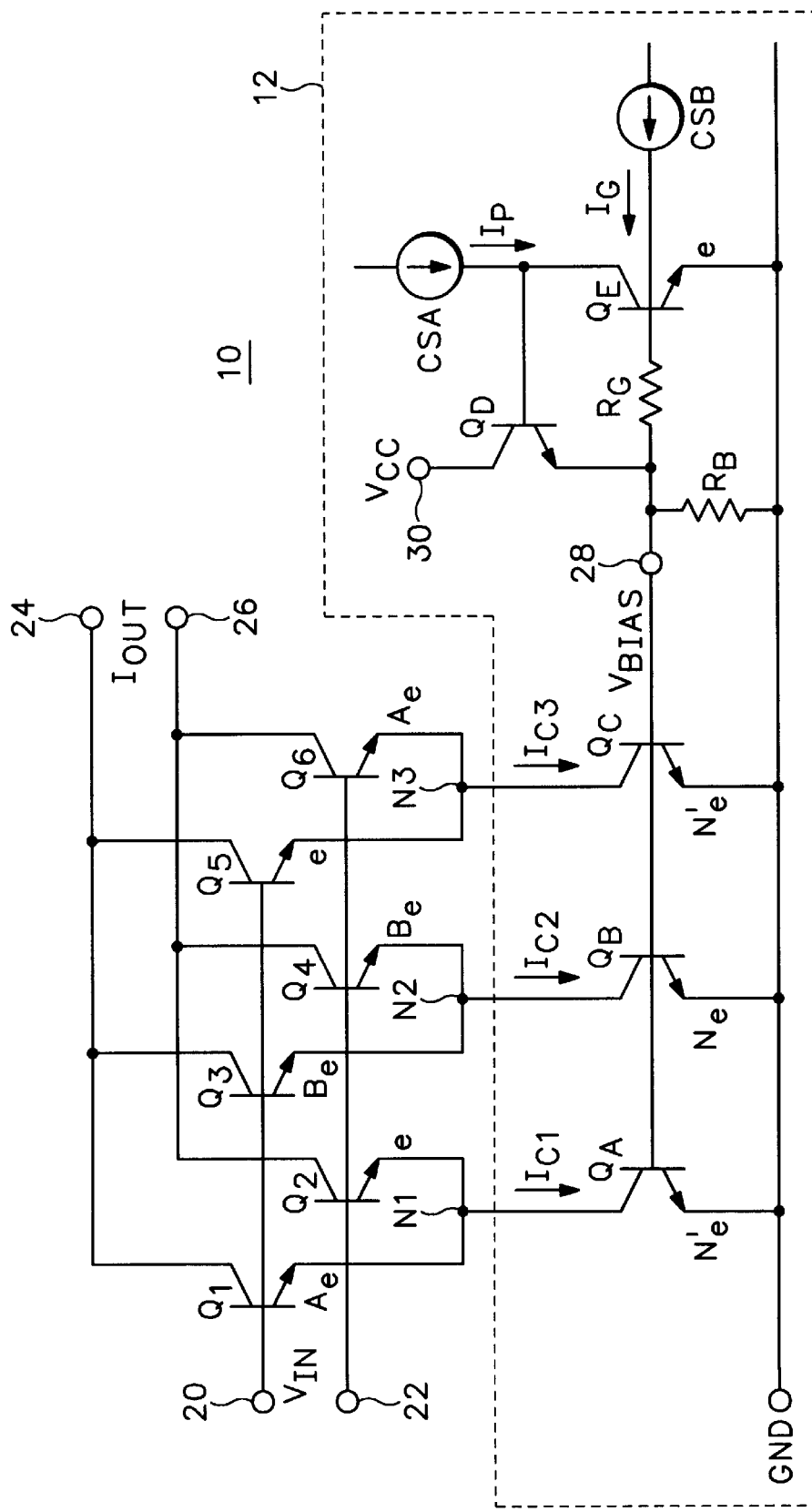
FIG. 3 is a schematic diagram of another prior art multi-tanh triplet cell having linear-in-dB gain control.
Figure 4:
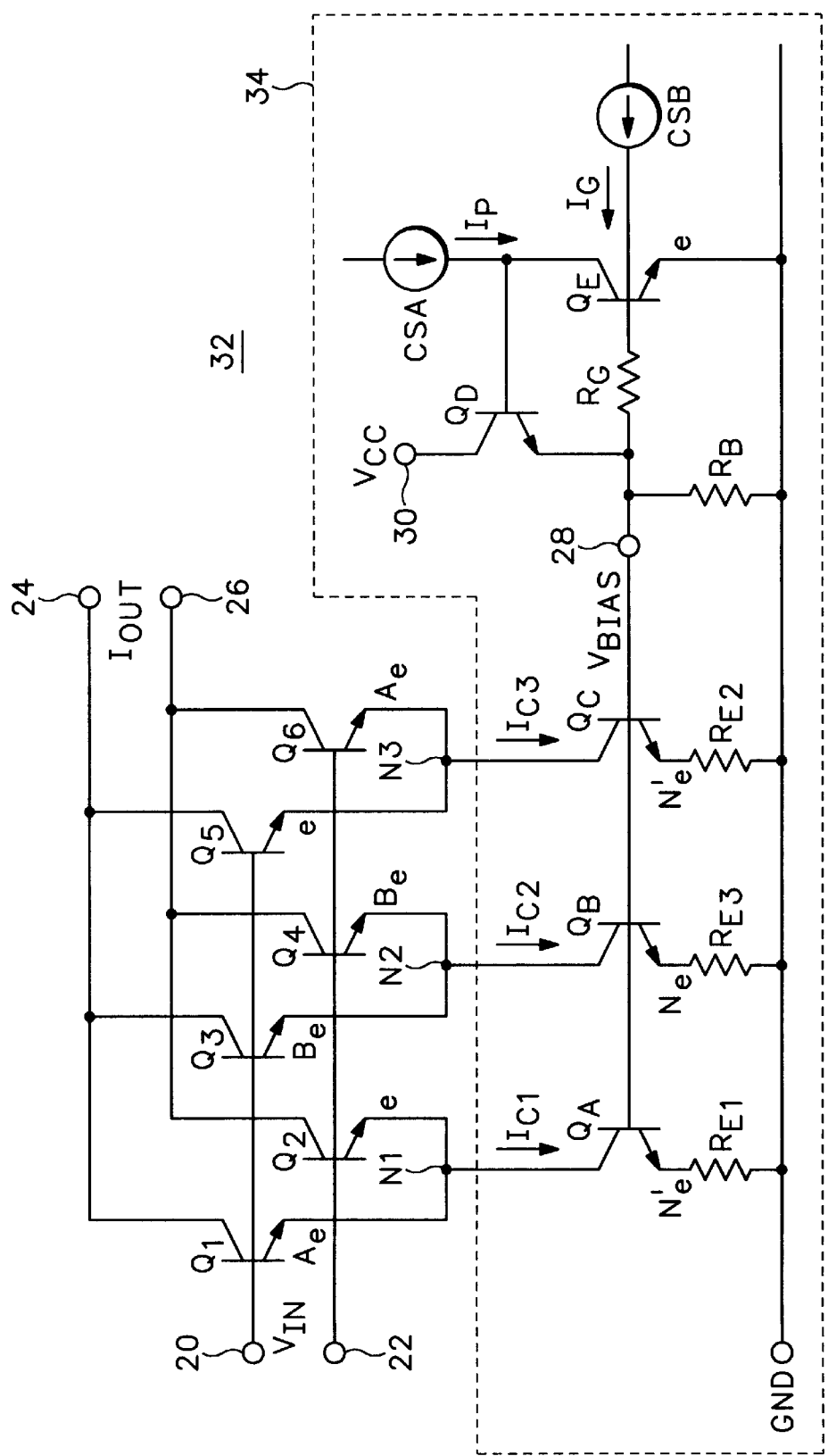
FIG. 4 is a schematic diagram of a first embodiment of a multi-tanh triplet cell in accordance with the present invention having biasing transistors with emitter degeneration.

A first embodiment of a variable-gain, multi-tanh triplet cell constructed in accordance with the preset invention is shown generally at 32 in FIG. 4. The circuit of FIG. 4 is similar to that of FIG. 3, except that the current mirror transistors QA, QB and QC are degenerated by inserting degeneration resistors $R_{E1}$, $R_{E2}$, and $R_{E3}$ between the emitters of QA, QB and QC, respectively, and GND.

The operation of the circuit of FIG. 4 is similar to that of FIG. 3, except that the use of degeneration resistors reduces the amount of uncorrelated (independent) noise contributed by the current mirror transistors, some of which is due to the base resistances of the transistors. The degeneration resistors provide the same noise reduction effect when used with other multi-tanh "n-tuples". For example, a multi-tanh doublet having only two differential pairs of transistors can be biased by two current mirror transistors having degeneration transistors in their emitter paths.

Degenerated Current Source Transistors with Linear-in-dB Gain Control

Although the degeneration resistors $R_{E1}$, $RE_2$, and $R_{E3}$ of FIG. 4 reduce the noise of the circuit, they also destroy the linear-in-dB characteristics. A circuit which provides the noise reduction benefits of the degeneration resistors of FIG. 4 while also providing linear-in-dB gain control is shown generally at 52 in FIG. 5 which is a schematic diagram of a second embodiment of a variable-gain, multi-tanh triplet cell constructed in accordance with the preset invention.

Figure 5:
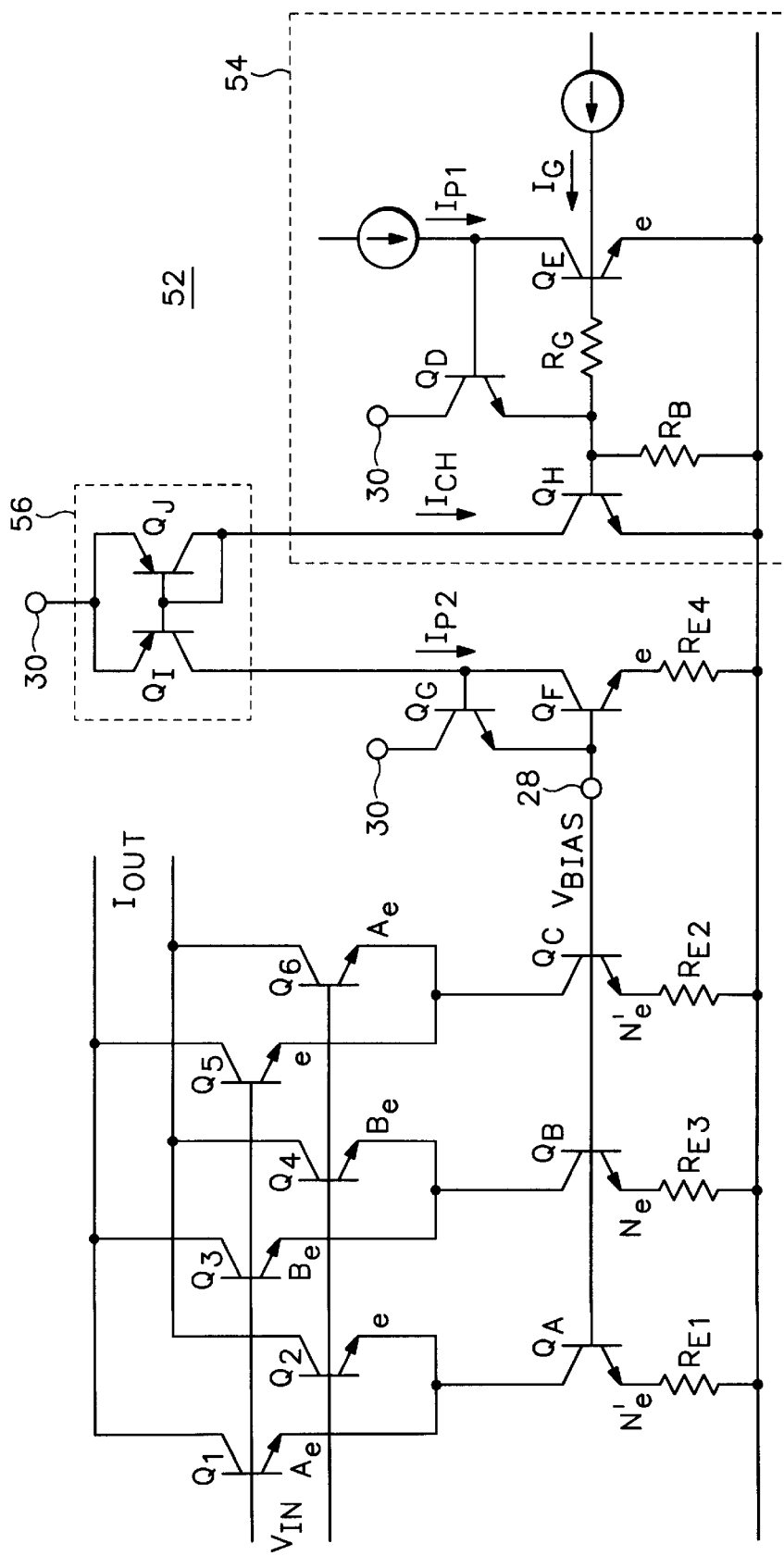
FIG. 5 is a schematic diagram of a second embodiment of a multi-tanh triplet cell in accordance with the present invention having emitter degeneration and linear-in-dB gain control.

The circuit of FIG. 5 includes a multi-tanh triplet core having first, second, and third differential pairs of transistors Q1–Q2, Q3–Q4 and Q5–Q6, respectively, as well as a bias circuit that includes current source transistors QA, QB, and QC having emitter degeneration resistors $R_{E1}$, $R_{E2}$, and $R_{E3}$, respectively, like those of FIG. 4. However, the bias circuit of FIG. 5 includes an NPN transistor QF that is connected to provide a bias voltage signal $V_{BIAS}$ that causes the gain of the triplet to vary linearly in response changes in a primary current $I_{P2}$.

Transistor QF has a collector coupled to receive the primary current $I_{P2}$, an emitter coupled to ground through an emitter resistor $R_{E4}$, and a base connected to the base terminals of current source transistors QA, QB, and QC through bias terminal 28. An NPN transistor QG has a base connected to the collector of QF, an emitter connected to the base of QF, and a collector connected to a positive power supply voltage.

Since the gain of the triplet of FIG. 5 varies linearly in response to changes in a primary current $I_{P2}$, a linear-in-dB gain characteristic can be imparted to the triplet by generating the primary current $I_{P2}$ in a manner that varies exponentially in response to a gain control signal. The circuit of FIG. 5 accomplishes this through a linear-in-dB cell 54 and a PNP current mirror 56.

The linear-in-dB cell 54 includes transistors QD and QE, resistors $R_B$ and $R_G$, and current sources $I_{P1}$ and $I_G$ which are connected in the same manner as the corresponding components of FIG. 3. The collector of transistor QD is connected to the base of a current source transistor QH which has an emitter connected to GND.

The PNP current mirror 56 includes a first transistor QJ which is diode connected with its base connected to its collector. The emitter of QJ is connected to a positive power supply 30, and the collector of QJ is connected to the collector of QH. Current mirror 56 also includes a second transistor QI having an emitter connected to the positive power supply 30, a base connected to the base of QJ, and a collector connected to the connector of QF. The current mirror 56 is shown as a simple current mirror in FIG. 5 for purposes of illustration, but preferably includes conventional current mirror enhancements for improved performance.

The linear-in-dB cell 54 operates in the same manner as that of FIG. 3 to generate a current $I_{CH}$ at the collector of QH which varies exponentially in response to changes in the gain control current $I_G$. The current $I_{CH}$ is coupled to transistor QF through current mirror 56, thereby providing a linear-in-dB gain characteristic to the triplet core in response to the gain control current $I_G$. The value of emitter restor $R_{E4}$ determines the values of the collector currents in QA, QB and QC.

Variable Shape $g_m$ Function

Figure 6:
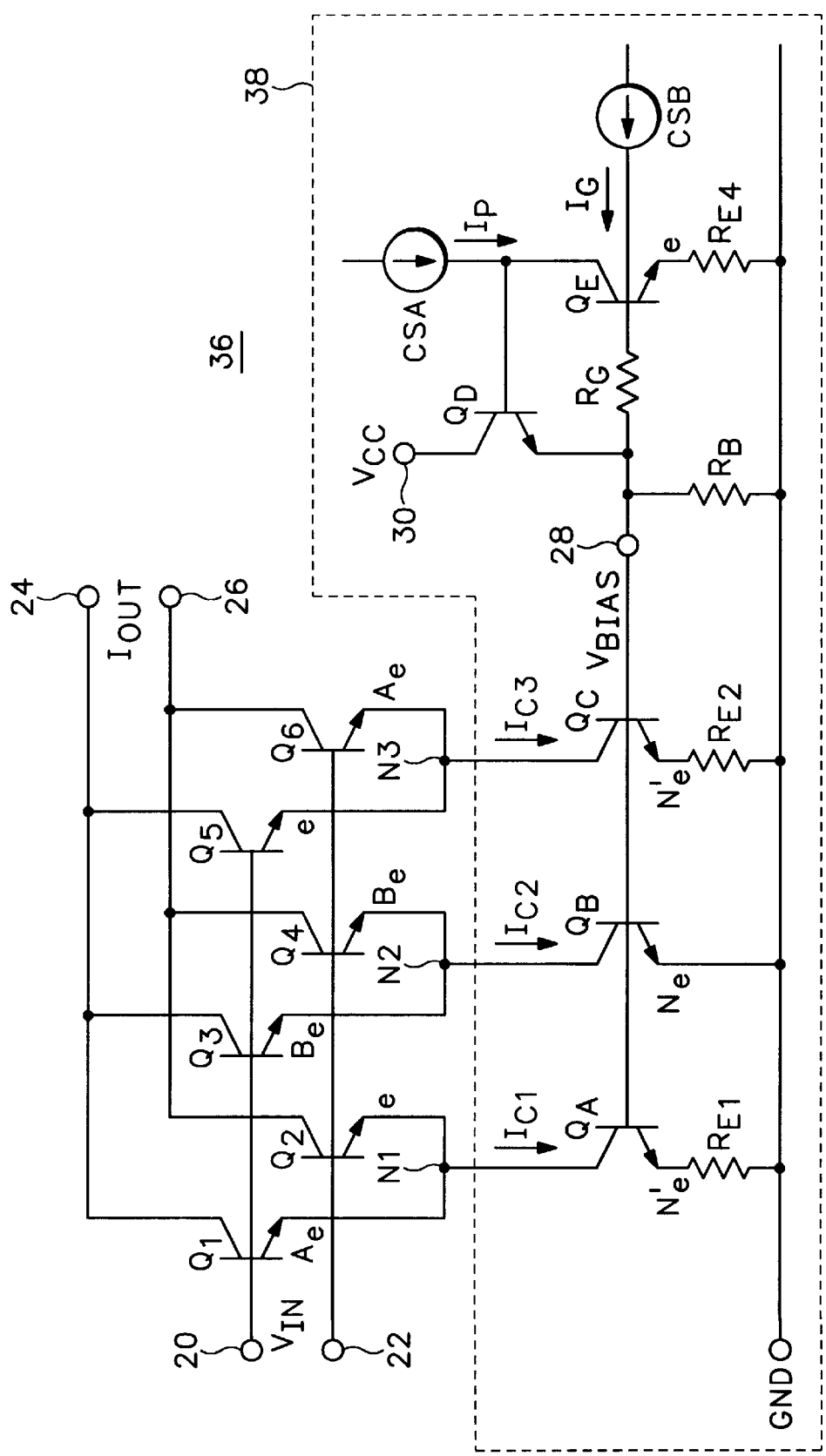
FIG. 6 is a schematic diagram of a third embodiment of a multi-tanh triplet cell in accordance with the present invention having a variable shape transconductance function.

Another embodiment of a variable-gain, multi-tanh triplet cell constructed in accordance with the preset invention is shown generally at 36 in FIG. 6. The circuit of FIG. 6 is similar in structure to that of FIG. 3, except that emitter resistor $R_{E1}$ is inserted between the emitter of QA and GND and emitter resistor $R_{E2}$ is inserted between the emitter QC and GND, while QB is not emitter-degenerated. Another degeneration resistor $RE_4$ can be included in the emitter path of QE to alter the magnitude of all of the currents in QA, QB and QC.

In a manner similar to the circuit of FIG. 3, the bias circuit 38 in FIG. 6 provides linear-in-dB gain control in response to the gain control signal $I_G$. However, not only does the bias circuit vary the absolute magnitudes of the bias currents $I_{C1}$, $I_{C2}$ and $I_{C3}$, but it also varies the relative magnitudes of the bias currents so as to change the shape of the composite transconductance curve as the gain changes, with the objective of lowering the noise at high gain.

Figure 1:
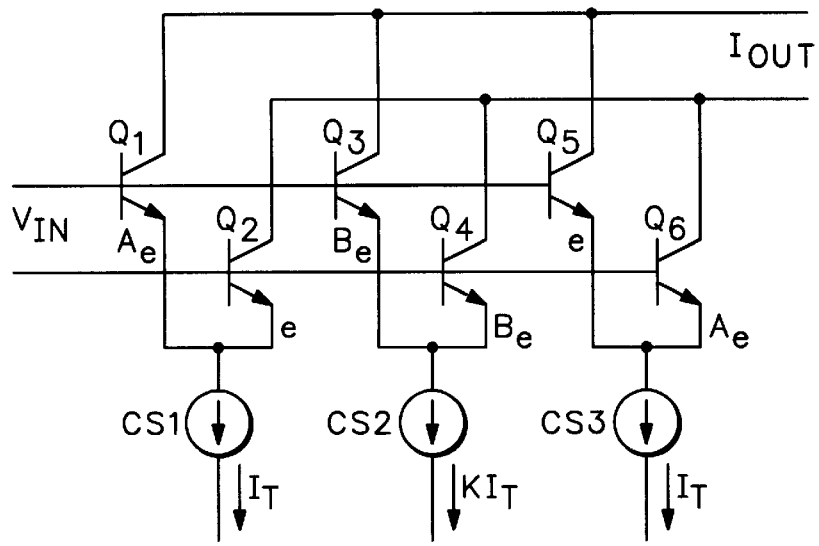
FIG. 1 is a schematic diagram of a prior art multi-tanh triplet cell.
Figure 2:
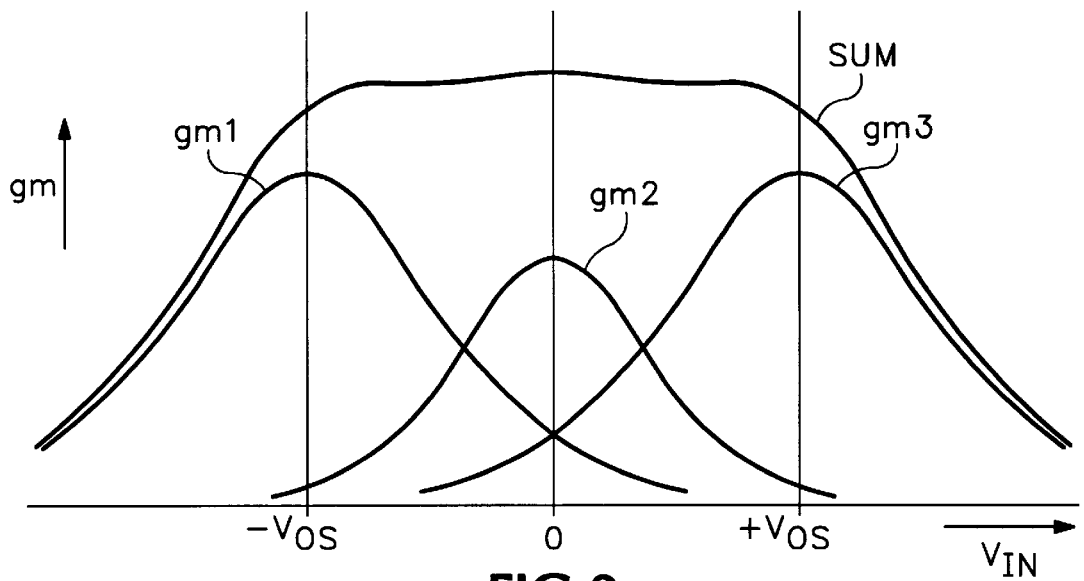
FIG. 2 is a graph of the incremental transconductance function of the circuit of FIG. 1.

At low bias currents, hence low gain, the back-EMF generated in resistors $R_{E1}$ and $R_{E2}$ has little effect on the currents in each of QA and QC, which are approximately equal to $I_{C2}$ times N'/N (which is similar to the factor 1/K in FIG. 1). Thus, at low gain, the outer differential pairs Q1–Q2 and Q5–Q6 operate in conjunction with the inner pair Q3–Q4 in much the same manner as a triplet with fixed bias ratios, and distortion is minimized over an extended range of input voltages for coping with high level signals.

At high gain, as the absolute magnitude of all the bias currents increase, the back-EMF generated across emitter resistors $R_{E1}$ and $R_{E2}$ reduces the relative magnitudes of the bias currents $I_{C1}$ and $I_{C3}$ with respect to $I_{C2}$, thereby diminishing the relative gains of the outer differential pairs in the triplet core with respect to the inner differential pair, eventually rendering the outer differential pairs almost inoperative. Thus, at high gain, the triplet core is effectively reduced to a single differential pair of transistors, having much lower noise. This is because the overall noise of the triplet becomes dominated by the center differential pair when the relative bias currents for the outer pairs are moderately lower than the bias current for the center pair. Although the overall transconductance function is now linear over a smaller range of input voltages at high gain than at low gain, this is generally of little consequence in practice because the high gain mode is only used when the input signal is small.

The factor N/N' is selected in conjunction with the emitter area ratio A to optimize the transconductance curve for maximum linearity at low gain. It is somewhat modified by the inclusion of the emitter resistors.

The emitter resistor RE4 increases the voltage at the base of QE, as well as $V_{BIAS}$, thereby increasing the bias currents $I_{C1}$, $I_{C2}$ and $I_{C3}$ through current source transistors QA, QB and QC. The increase in the bias current is given by the expression $\Delta I = \exp(I_P R_P / V_T)$, so a resistor that provides just a few millivolts between the emitter of QE and GND provides a significant increase in the bias currents. For example, in an exemplary embodiment in which $R_{E1}$ and $R_{E2}$ each have a resistance of 250 ohms, a voltage drop of 60 mV across $R_{E4}$ increases the bias currents by a factor of about ten. Thus, the primary current $I_P$ required to generate the required bias currents in QA, QB and QC is reduced. This is especially important in battery powered systems which must consume as little power as possible.

Figure 7:
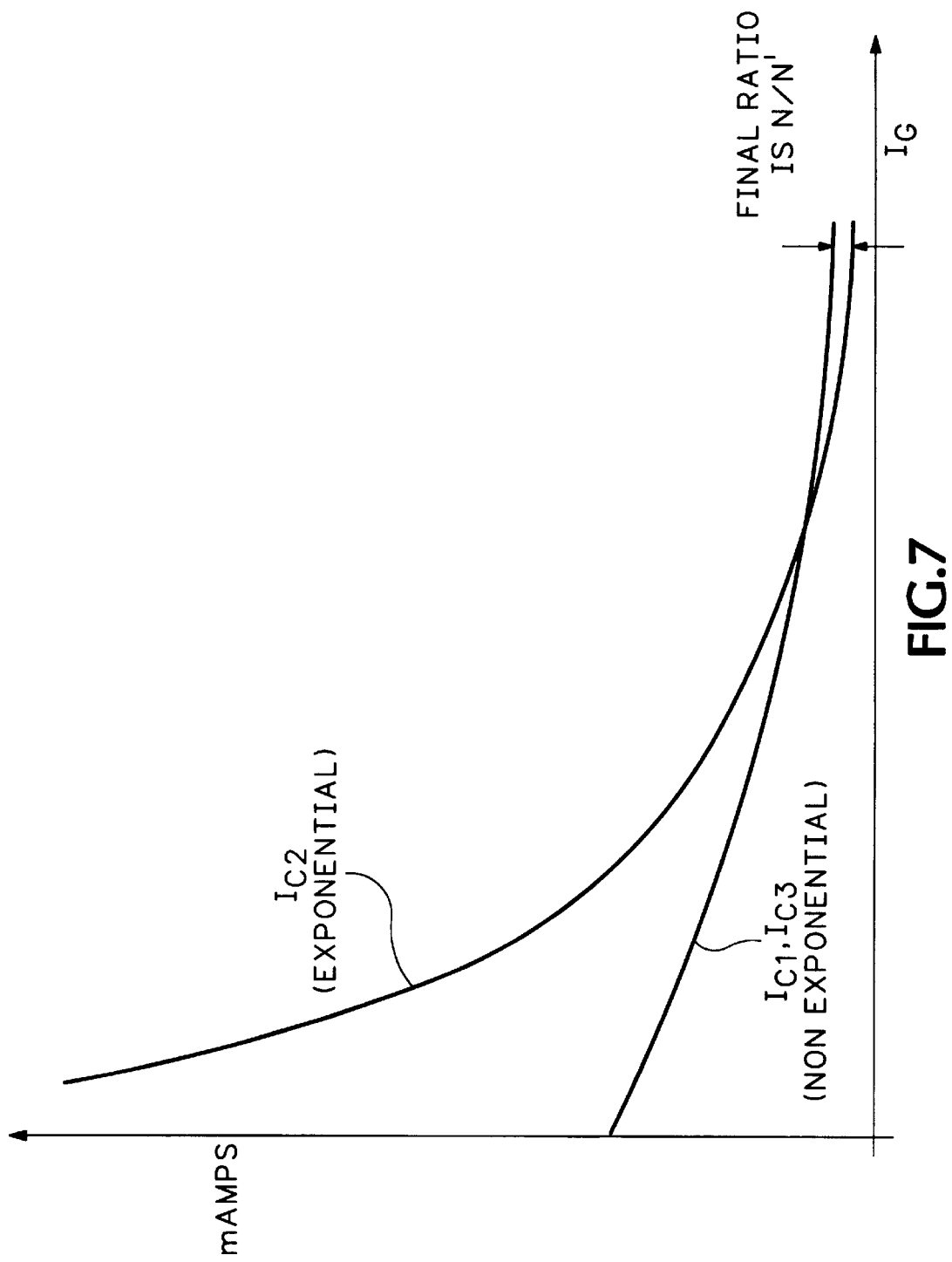
FIG. 7 is a graph showing the relative magnitude of the bias currents in the circuit of FIG. 6 as a function of the gain control signal.

FIG. 7 is a graph showing the relative magnitudes of $I_{C1}$, $I_{C2}$ and $I_{C3}$ in the circuit of FIG. 6 as a function of the gain control signal $I_G$. From FIG. 6 it can be seen that $I_{C1}$ and $I_{C3}$ are related to $I_{C2}$ by a simple ratio at high $I_G$ (low gain), but rapidly diverge from $I_{C2}$ as $I_G$ goes down (high gain). As the gain increases, (small $I_G$) $I_{C2}$ rises exponentially, but $I_{C1}$ and $I_{C3}$ rise at a lower rate.

Thus, in the circuit of FIG. 6, the bias voltage generator operates in a synergistic manner with the triplet core. The mirror transistors and emitter resistors to perform a dual function: (1) they provide linear-in-dB (exponential) gain control in response to linear variations in the gain control signal (current $I_G$), and (2) they dynamically alter the shape of the transconductance function by causing the triplet to operate as a simple differential pair at high gains (thus exhibiting the low noise of a minimal differential structure), while operating as a multi-tanh triplet at low gains (thus exhibiting maximum linearity). This scheme implements what may be called an "elastic transconductance", characterized by a constant area under the $g_m$-$V_{IN}$ curves.

Figure 8:
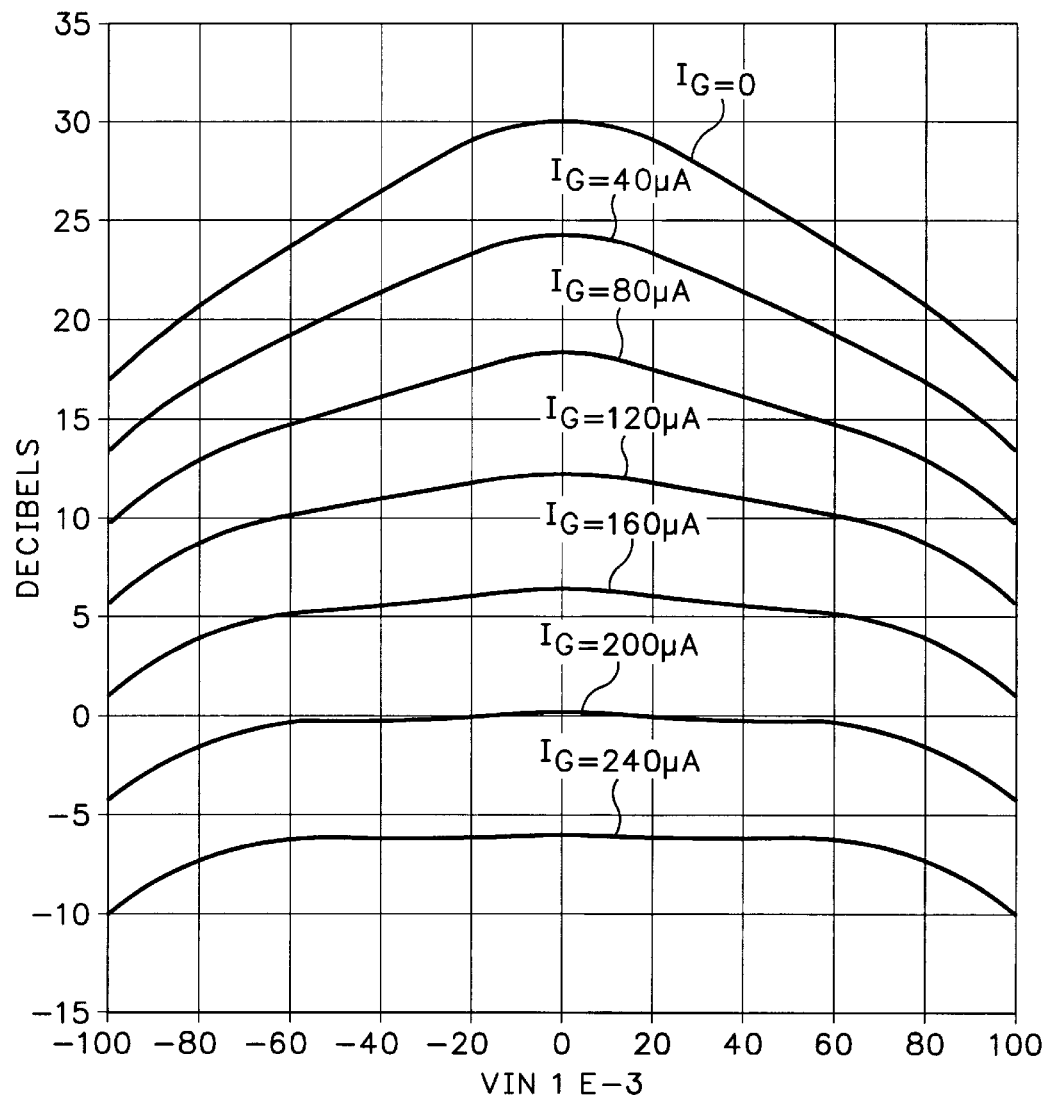
FIG. 8 is a graph of incremental gain curves for the circuit of FIG. 6.

FIG. 8 shows incremental gain curves for spot values of $I_G$ from zero to 240 μAP for a monolithic implementation of the circuit 36 of FIG. 6 using N=7, N'=10, A=15, $R_E$=145Ω, $R_G$=490Ω, and $I_P$=200 μAP, where "P" indicates that the currents vary in proportion to absolute temperature (PTAT). The gain varies over a 36 dB range.

Although the linear-in-dB gain function can now only be preserved in the circuit of FIG. 6 over a moderate range, using optimum component values, the conformance to an ideal gain law can be excellent over this limited range.

Figure 9:
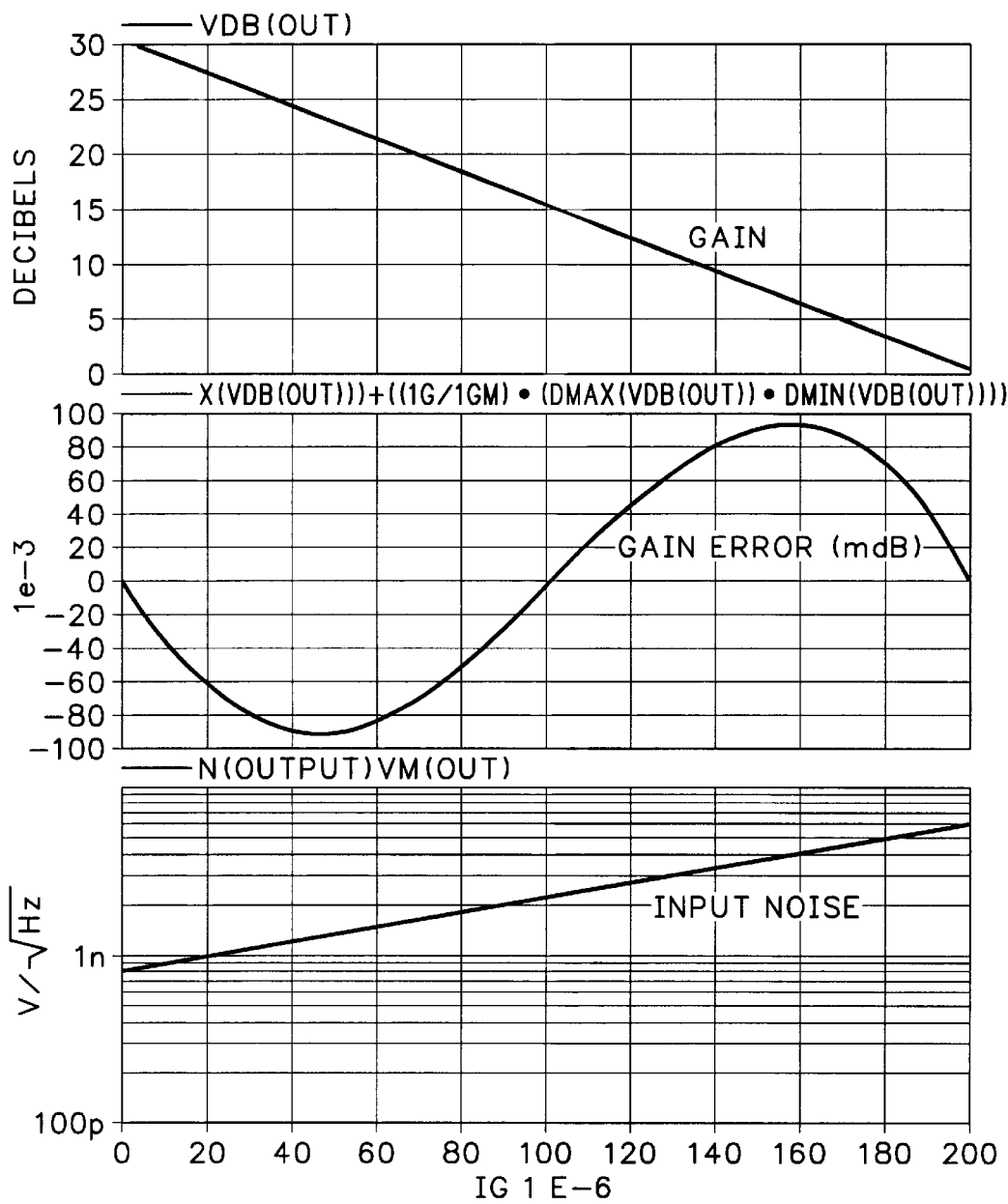
FIG. 9 is a drawing of graphs showing the gain, gain linearity, and short-circuit input-referred noise for the circuit of FIG. 6.

FIG. 9 shows the gain, the gain linearity of ±0.1 dB, and the short-circuit input-referred noise spectral density vs. $I_G$ for an amplifier based on an implementation of the circuit 36 of FIG. 6. At full gain, the noise is reduced to almost the level of a basic differential pair at the same tail current. The modified gain scaling is 0.15 dB/μA at T=300K, which internally corresponds to about 3.27 mV/dB. FIG. 11 is a table summarizing the cell performance at various values of $I_G$; the total bias current in the triplet section is $I_{BIAS}$.

The reduction in noise at high gains is due to several factors. First, since the outer differential pairs are almost fully de-biased at high gain, their noise contribution is negligible. This reduction in noise associated with the bias currents can be better understood by considering the noise signal component to the bias currents $I_{C1}$, $I_{C2}$ and $I_{C3}$ which contain uncorrelated noise components $I_{n1}$, $I_{n2}$ and $I_{n3}$, respectively, due to all noise sources from QA, QB and QC. Noise current $I_{n1}$ appears at the collector of Q1 multiplied by the factor A/(1+A), and at the collector of Q2 multiplied by 1/(1+A). Therefore, the difference appears at the output of Q1–Q2 as (A–1)/(A+1)$I_{n1}$. Likewise, the noise current $I_{n3}$ appears output of Q5–Q6 as (A–1)/(A+1)$I_{n3}$. However, since Q3–Q4 have the same emitter areas (that is, the stage is fully balanced), the noise current $I_{n2}$ is split equally and does not contribute to total noise at the output because it is strictly a common mode noise phenomena. To achieve this benefit, the loading of the transconductance cell must also be balanced.

A further benefit of the circuit of FIG. 6 is that it reduces the physical size of the transistors required for the outer differential pairs Q1–Q2 and Q5–Q6. This is possible because the Johnson noise of the outer pairs due to their base resistance is not critical in high gain mode since they are almost completely de-biased. This smaller size has several benefits, including low parasitic capacitance and higher transistor frequency ($f_T$) resulting in very significant improvements in high frequency response. (The emitter area "Be" of the inner pair of transistors Q3–Q4 should be kept relatively large to assure low base resistance, and therefore, low Johnson Noise.)

Another benefit of the circuit of FIG. 6 is that it reduces noise while not requiring as much supply-voltage headroom as the circuit of FIGS. 4 and 5. This is because the voltage drop that would be needed across emitter resistors to achieve a similar noise improvement would be about 250 mV.

An additional benefit of the circuit of FIG. 6 is that the emitter resistor $R_{E4}$ decreases the primary current required to set up the required bias currents through current source transistors QA, QB and QC, thereby reducing power consumption.

Yet another advantage of the circuit of FIG. 6 is that the shape of the transconductance function undergoes a smooth transition as the gain is continuously varied from its minimum to maximum value.

Emitter Follower Input Stage

Figure 12:
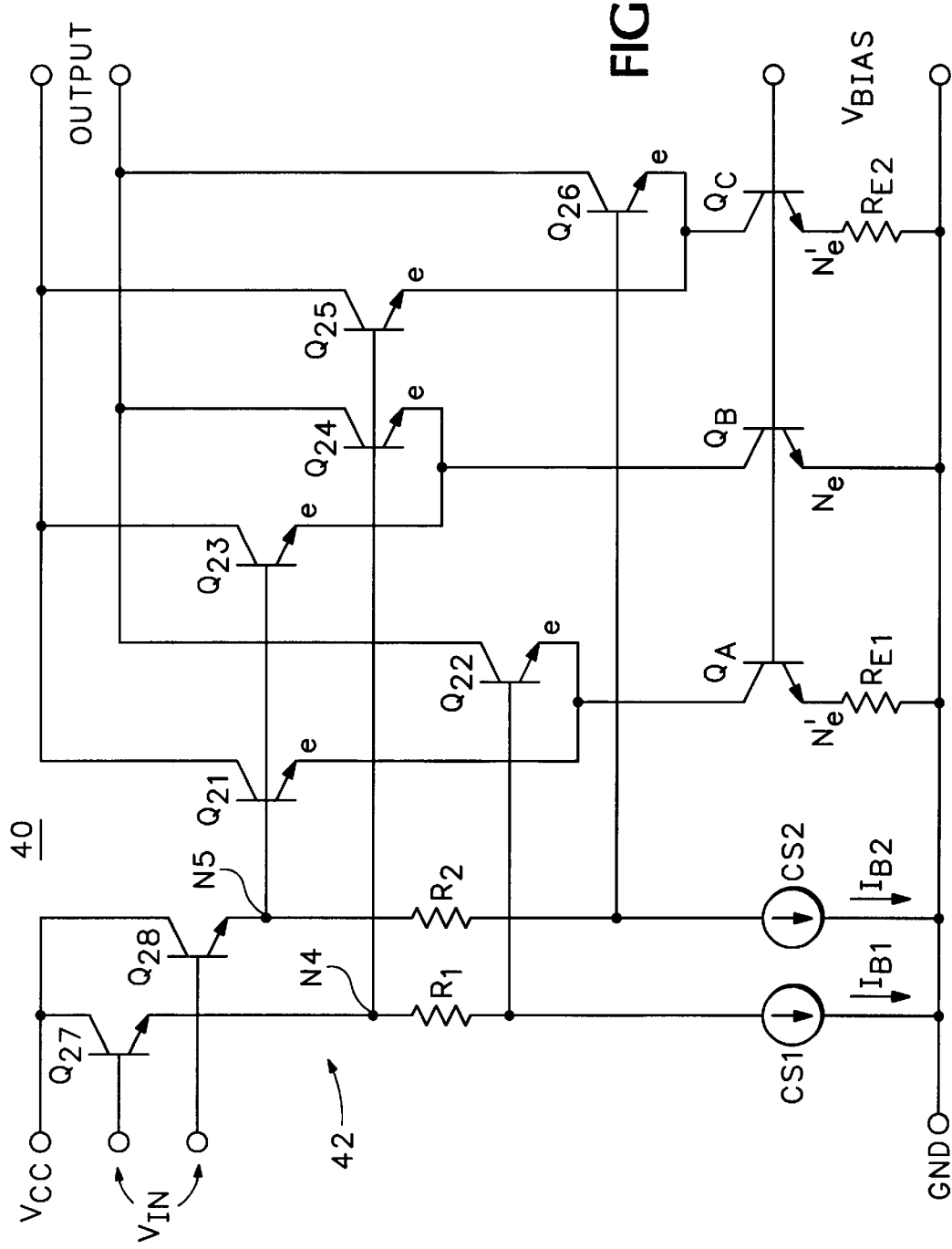
FIG. 12 is a schematic diagram of a fourth embodiment of a multi-tanh triplet cell in accordance with the present invention having ohmically induced input offset voltages.

FIG. 12 is a schematic diagram of a fourth embodiment of a multi-tanh cell 40 constructed in accordance with the present invention. In the circuit of FIG. 12, the offset voltages required in the outer pairs of transistors in the multi-tanh triplet core are introduced ohmically through the use of emitter follower transistors Q27 and Q28 and resistors $R_1$ and $R_2$ rather than through the use of emitter area ratios.

The multi-tanh cell 40 includes a triplet core having three pairs of transistors Q21–Q22, Q23–Q24 and Q25–Q26 which have emitters and collectors that are connected in the same manner as transistor pairs Q1–Q2, Q3–Q4 and Q5–Q6, respectively, in FIG. 6. Unlike the circuit of FIG. 6, however, the emitter areas of transistors Q21–Q22, Q23–Q24 and Q25–Q26 are all equal. The three pairs of transistors are connected to bias transistors QA, QB and QC which are driven by a bias special voltage $V_{BIAS}$ in the manner provided by the bias circuit of FIG. 6. The resistors $R_{E1}$ and $R_{E2}$ cause the contribution of the outer transistor pairs to decrease at higher gains, thereby providing the same $g_m$ curve shaping benefit as in the circuit of FIG. 6.

Referring again to FIG. 12, the base terminals of transistors Q21 and Q23 are commonly connected to the emitter of a first NPN emitter follower transistor Q28 in an input circuit 42, while the base terminals of transistors Q24 and Q25 are commonly connected to the emitter of a second NPN emitter follower transistor Q29. The collector terminals of transistors Q27 and Q28 are both connected to a positive power supply terminal. Resistor $R_1$ has a first terminal connected to the emitter of Q27 at node N4 and a second terminal connected to the base of Q22. Resistor $R_2$ has a first terminal connected to the emitter of Q28 at a node N5 and a second terminal connected to the base of Q26. A first current source CS1, which generates a current signal $I_{B1}$, is connected between the second terminal of $R_1$ and GND. A second current source CS2, which generates a current signal $I_{B2}$, is connected between the second terminal of $R_2$ and GND.

In operation, the input signal is applied to the bases of the emitter follower transistors Q27 and Q28. The inner pair of transistors Q23 and Q24 are driven directly from Q27 and Q28. In the outer pairs, transistors Q21 and Q25 are driven directly by the emitter followers Q28 and Q27, respectively, so they see no offset voltage at their bases. However, the bases of transistors Q22 and Q26 see an offset voltage created by the signal-independent voltage drop across resistors $R_1$ and $R_2$, respectively. By choosing the values of the bias currents $I_{B1}$, and $I_{B2}$ and the resistors $R_1$ and $R_2$ so that the DC voltage across resistors $R_1$ and $R_2$ is equal to $V_T$lnA, the offset voltages of the transistor pairs can be adjusted to provide an equivalent emitter area ratio of A. For example, a voltage of 60 mV is equivalent to an area ratio of about 10. The $g_m$ function of the circuit of FIG. 12 will thus be the same as the circuit of FIG. 6 without the use of transistors with different emitter areas, thereby allowing the use of smaller transistors in the multi-tanh core.

Another benefit of the emitter followers Q27 and Q28 is that they provide impedance transformation at the input. The impedance looking into the emitter followers is much higher than that seen looking into the differential input of the multi-tanh proper.

A further benefit of the circuit of FIG. 12 is that it can lower the noise current at the input because transistors Q27 and Q28 buffer some of the noise associated with running Q23 and Q24. This is true even though the emitter follower transistors Q27 and Q28 introduce some shot noise of their own.

As the temperature increases, the width of the linear portion of the $g_m$ function increases. If the current signals $I_{B1}$ and $I_{B2}$ change in proportion to absolute temperature, the shape of the $g_m$ function remains constant. Therefore, the current signals $I_{B1}$ and $I_{B2}$ are preferentially PTAT so that the shape of the $g_m$ function does not change with temperature. (If ratioed emitter areas are used to introduce the offset voltages, the shape of the $g_m$ function does not change with temperature).

If the impedance transformation of the emitter follower transistors Q27 and Q28 is not needed, the input signal can be applied directly to nodes N4 and N5, and the resistors $R_1$ and $R_2$ will still provide the necessary input offset voltages.

Series Connected Triplet

Figure 13:
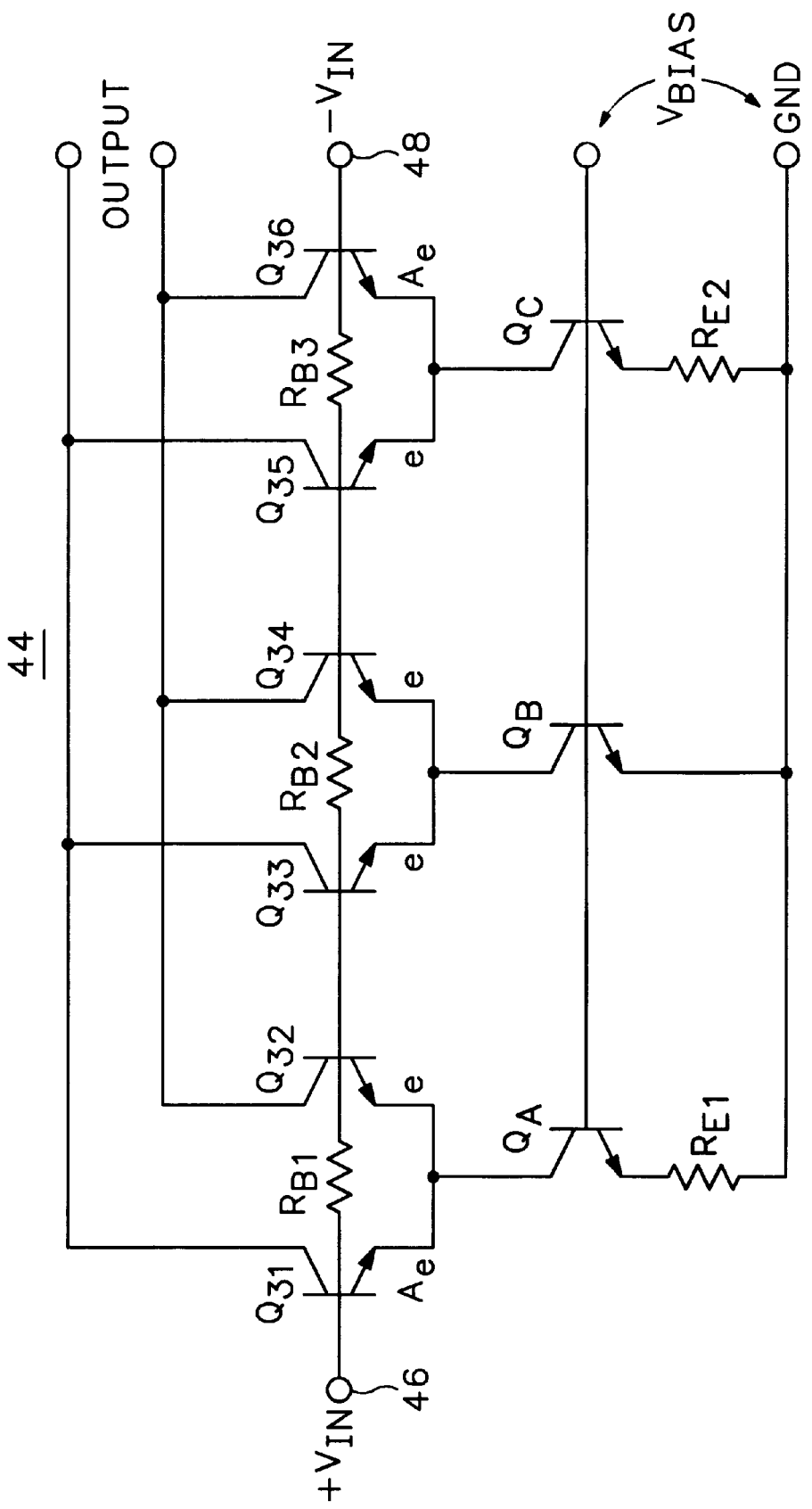
FIG. 13 is a schematic diagram of a fifth embodiment of a multi-tanh triplet cell in accordance with the present invention having a series connected triplet core.

FIG. 13 is a schematic diagram of a fifth embodiment of a multi-tanh cell 44 constructed in accordance with the present invention. The multi-tanh cell 44 includes a series connected triplet core having three pairs of transistors Q31–Q32, Q33–Q34 and Q35–Q36 which have emitters and collectors that are connected in the same manner as transistor pairs Q1–Q2, Q3–Q4 and Q5–Q6, respectively, in FIG. 6. The emitter areas of the three pairs are also ratioed in the same manner as those in FIG. 6. However, unlike the circuit of FIG. 6, the base terminals of the three pairs of transistors in FIG. 13 are connected in series with resistors $R_{B1}$, $R_{B2}$ and $R_{B3}$ interposed between the base terminals of pairs Q1–Q2, Q3–Q4 and Q5–Q6, respectively.

The three pairs of transistors are connected to bias transistors QA, QB and QC which are driven by a bias voltage $V_{BIAS}$ in the same manner as the bias circuit of FIG. 6. The resistors $R_{B1}$ and $R_{B2}$ cause the contribution of the outer transistor pairs to decrease at higher gains, thereby providing the same $g_m$ curve shaping benefit as in the circuit of FIG. 6.

Referring again to FIG. 13, the input voltage is applied across the terminals 46 and 48. The center pair Q33–Q34 only sees a fraction of the input signal. If the resistances of $R_{B1}$ and $R_{B3}$ are equal, and $R_{B2}=BR_{B1}$, then the input voltage received by the center pair is equal to $V_{IN}B/(B+2)$. The noise is also multiplied $B/(B+2)$, and additional noise is added by the resistors $R_{B1}$, $R_{B2}$ and $R_{B3}$. However, the circuit of FIG. 13 is particularly suited for use in moderate noise applications requiring wider dynamic range. As an example, if B=1, then each pair of transistors receives one-third of the input signal, and thus, the triplet core has three times the input signal capacity. However, the circuit has less than three times the noise, so the overall dynamic range of the circuit is improved.

Quadlet

Figure 14:
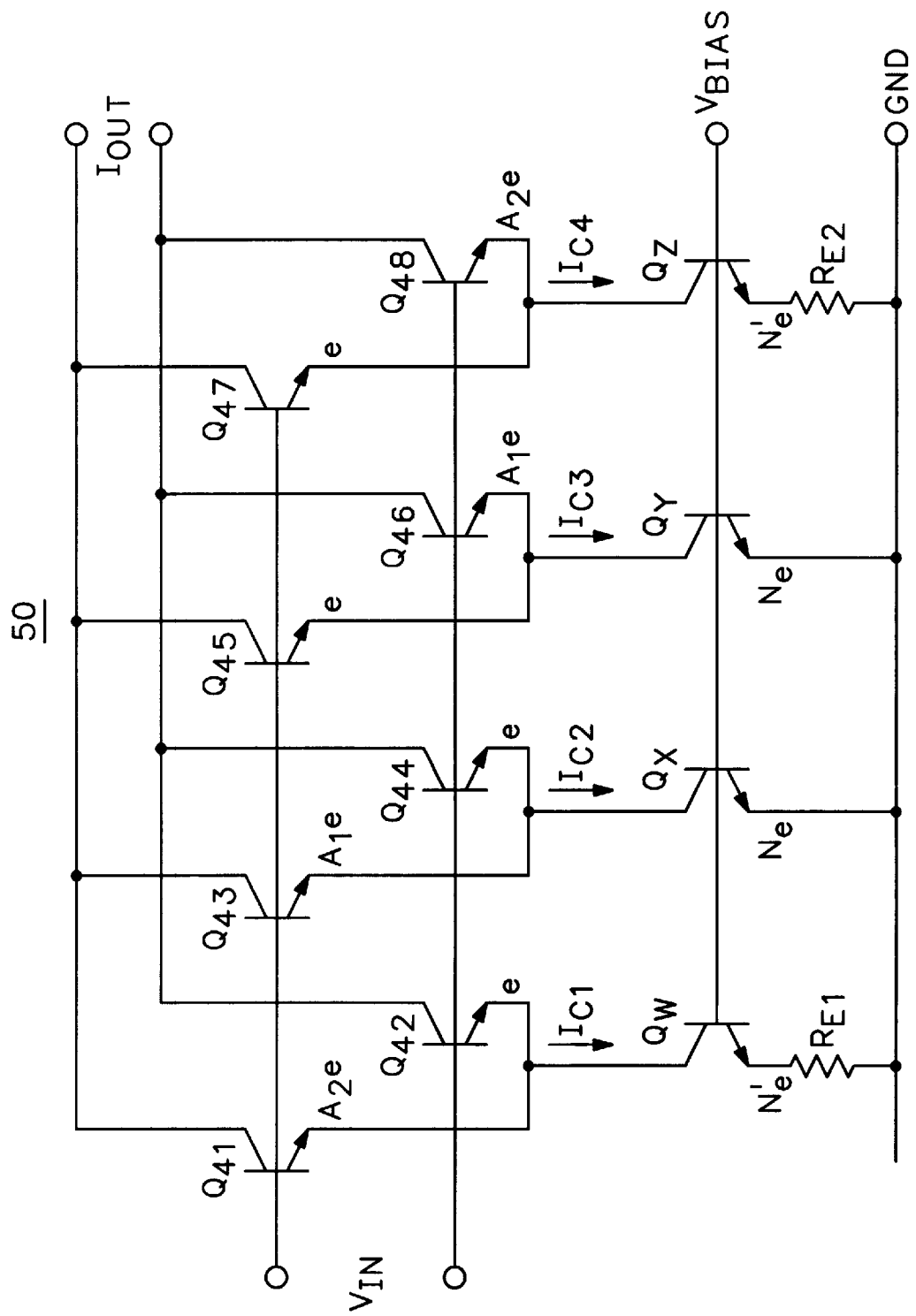
FIG. 14 is a schematic diagram of a sixth embodiment of a multi-tanh cell in accordance with the present invention having a quadlet core.

FIG. 14 is a schematic diagram of a sixth embodiment of a multi-tanh cell 50 constructed in accordance with the present invention. The circuit of FIG. 14 includes a multi-tanh "quadlet" core having four differential pairs of transistors: "inner" pairs Q43–Q44 and Q45–Q46, and "outer pairs" Q41–Q42 and Q47–Q48. With the quadlet core, two different emitter area ratios are used to provide the necessary input offset voltages. Transistors Q42, Q44, Q45 and Q47 have emitters with a unit area of "e", transistors Q43 and Q46 have emitter areas of $A_1e$, and transistors Q41 and Q48 have emitter areas of $A_2e$. Alternatively, the offset for the inner pairs can be implemented by actually using ratioed emitter areas, while the offset for the outer pairs can be introduced ohmically using PTAT (proportional to absolute temperature) current sources and resistors to synthesize effective emitter area ratios in a manner similar to that employed by the circuit of FIG. 13.

The circuit of FIG. 14 includes a bias section that includes four bias transistors QW, QX, QY and QZ for providing bias currents IC1, $I_{C2}$, $I_{C3}$ and $I_{C4}$, respectively, to the four transistor pairs in the quadlet core. The bases of transistors QW, QX, QY and QZ receive a bias voltage signal $V_{B1AS}$ which can be a linear-in-dB signal such as that generated by the linear-in-dB cell of FIG. 6, or a linear-in-gain signal generated by a simple current mirror as described below. Referring again to FIG. 14, the outer bias transistors QW and QZ have degeneration resistors $R_{E1}$ and $R_{E2}$ inserted between their emitters and ground. These resistors provide $g_m$ function shaping operation similar to that achieved by the circuit of FIG. 6. Transistors QW and QZ have emitter areas of N'e, while transistors QX and QY have emitter areas of Ne. The ratios N/N', $A_1$ and $A_2$ can be adjusted to provide an optimally flat $g_m$ function over a wide range of input voltages in a manner similar to the circuit of FIG. 1.

Referring again to FIG. 14, at low bias currents, hence low gain, there is little back emf across the degeneration resistors $R_{E1}$ and $R_{E2}$, so all four of the differential pairs in the quadlet core contribute to the output function so that it has maximum linearity, and circuit can handle a wide range of input voltages while maintaining low distortion.

At high bias currents, hence high gain, the back emf across the degeneration resistors $R_{E1}$ and $R_{E2}$ increases and causes the relative magnitudes of the outer bias currents $I_{C1}$ and $I_{C4}$ to decrease relative to the inner bias currents $I_{C2}$ and $I_{C3}$. As the bias currents continue increasing, the outer transistor pairs are eventually rendered inoperative, and the $g_m$ function of the quadlet collapses to that of a lower noise multi-tanh double.

The circuit of FIG. 14 provides the same advantages of the circuit of FIG. 6, described above, while providing a wider input voltage range.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A multi-tanh cell comprising:
   a multi-tanh core having a plurality of differential pairs of transistors;
   a bias circuit coupled to the multi-tanh core for providing a plurality of bias currents and arranged so that each of the bias currents biases one of the differential pairs of transistors; and
   a bias signal generator for generating a bias signal responsive to a control signal;
   wherein the bias circuit varies the magnitude of a first one of the bias currents relative to at least a second one of the bias currents, thereby varying the shape of the transconductance function of the core;

wherein the multi-tanh core includes a first differential pair of transistors coupled to a first node for receiving a first bias current, a second differential pair of transistors coupled to a second node for receiving a second bias current, and a third differential pair of transistors coupled to a third node for receiving a third bias current;

wherein the bias circuit includes:
 a first bias transistor coupled to the first node for providing the first bias current;
 a second bias transistor coupled to the second node for providing the second bias current; and
 a third bias transistor coupled to the third node for providing the third bias current;

wherein:
 the first bias transistor includes a first terminal coupled to the first node, a second terminal coupled to a power supply terminal, and a third terminal coupled to the bias signal generator to receive the bias signal;
 the second bias transistor includes a first terminal coupled to the second node, a second terminal coupled to the power supply terminal, and a third terminal coupled to the bias signal generator to receive the bias signal; and
 the third bias transistor includes a first terminal coupled to the third node, a second terminal coupled to the power supply terminal, and a third terminal coupled to the bias signal generator to receive the bias signal; and wherein the bias circuit further includes:
 a first degeneration resistor coupled between the second terminal of the first bias transistor and the power supply terminal; and
 a second degeneration resistor coupled between the second terminal of the third bias transistor and the power supply terminal.

2. A multi-tanh cell according to claim 1 wherein the bias signal generator includes a first current mirror transistor coupled to the first, second, and third bias transistors to form a multiple output current mirror with the first, second, and third bias transistors.

3. A multi-tanh cell according to claim 2 wherein:
 the first current mirror transistor has a first terminal coupled to receive a primary current signal, a second terminal coupled to the power supply terminal, and a third terminal coupled to receive a control signal; and the bias signal generator further includes:
 a first resistor having a first terminal coupled to the third terminals of the first, second, and third bias transistors and a second terminal coupled to the second terminal of the first current mirror transistor;
 a second current mirror transistor having a first terminal coupled to the first terminal of the first current mirror transistor, a second terminal coupled to a second power supply terminal, and a third terminal coupled to the second terminal of the first resistor; and
 a second resistor coupled between the third terminal of the second current mirror transistor and the power supply terminal.

4. A multi-tanh cell comprising:
 a multi-tanh core having a plurality of differential pairs of transistors; and
 a bias circuit coupled to the multi-tanh core for providing a plurality of bias currents and arranged so that each of the bias currents biases one of the differential pairs of transistors;

wherein the bias circuit varies the magnitude of a first one of the bias currents relative to at least a second one of the bias currents, thereby varying the shape of the transconductance function of the core;

wherein the multi-tanh core includes a first differential pair of transistors coupled to a first node for receiving a first bias current, a second differential pair of transistors coupled to a second node for receiving a second bias current, a third differential pair of transistors coupled to a third node for receiving a third bias current, and a fourth differential pair of transistors coupled to a fourth node for receiving a fourth bias current; and wherein the bias circuit includes:
 a first bias transistor coupled to the first node for providing the first bias current responsive to a bias signal;
 a second bias transistor coupled to the second node for providing the second bias current responsive to the bias signal;
 a third bias transistor coupled to the third node for providing the third bias current responsive to the bias signal;
 a fourth bias transistor coupled to the fourth node for providing the fourth bias current responsive to the bias signal;
 a first degeneration resistor coupled between the second terminal of the first bias transistor and the power supply terminal;
 a second degeneration resistor coupled between the second terminal of the fourth bias transistor and the power supply terminal; and
 a bias signal generator coupled to the first, second, third, and fourth bias transistors for generating the bias signal responsive to a control signal.

5. A multi-tanh triplet cell comprising:
 a multi-tanh triplet core having a first differential pair of transistors coupled to a first node, a second differential pair of transistors coupled to a second node, and a third differential pair of transistors coupled to a third node;
 a bias signal generator having an output terminal;
 a first bias transistor having a first terminal coupled to the first node, a second terminal coupled to the output terminal of the bias signal generator, and a third terminal;
 a second bias transistor having a first terminal coupled to the second node, a second terminal coupled to the output terminal of the bias signal generator, and a third terminal coupled to a power supply terminal;
 a third bias transistor having a first terminal coupled to the third node, a second terminal coupled to the output terminal of the bias signal generator, and a third terminal;
 a first degeneration resistor coupled between the third terminal of the first transistor and the power supply terminal; and
 a second degeneration resistor coupled between the third terminal of the third transistor and the power supply terminal.

6. A multi-tanh triplet cell according to claim 5 wherein the bias signal generator includes a first current mirror transistor coupled to the output terminal of the bias signal generator and arranged to form a multiple output current mirror with the first, second, and third bias transistors.

7. A multi-tanh triplet cell according to claim 6 wherein the first current mirror transistor has a first terminal coupled to receive a primary current signal, a second terminal coupled to the power supply terminal, and a third terminal coupled to receive a control signal, and the bias signal generator further includes:

a first resistor coupled between the output terminal of the bias signal generator and the second terminal of the first current mirror transistor;

a second current mirror transistor having a first terminal coupled to the first terminal of the first current mirror transistor, a second terminal coupled to a second power supply terminal, and a third terminal coupled to the output terminal of the bias signal generator; and a second resistor coupled between the output terminal of the bias signal generator and the power supply terminal.

* * * * *

UNITED STATES PATENT AND TRADEMARK OFFICE
CERTIFICATE OF CORRECTION

PATENT NO. : 6,084,472
DATED : July 4, 2000
INVENTOR(S) : Gilbert

It is certified that error appears in the above-identified patent and that said Letters Patent is hereby corrected as shown below:

<u>Title page,</u>
Item [22], PCT Filed, date "Jan. 29, 1998" should read -- Jan. 28, 1998 --.

<u>Column 2,</u>
Line 10, "Linear-in dB Biasing" should read -- Linear-In dB Biasing --.

<u>Column 3,</u>
Line 34, "$V_{BE} / R_{B-IG}$" should read -- $V_{BE} / R_B - I_G$ --.

<u>Column 6,</u>
Line 38, "values of $I_G$. Fig 12 is a" should read -- values of $I_G$. FIG 12 is a --.

<u>Column 8,</u>
Line 49, "emitter resistor RE4 increases" should read -- emitter resistor $R_{E4}$ increases --.

<u>Column 9,</u>
Line 61, "higher transistor frequency" should read -- higher transition frequency --.

<u>Column 10,</u>
Line 62, "$V_T InA$" should read -- $V_T InA$ --.

<u>Column 12,</u>
Line 21, "linear-in-dB cell of FIG 6," should read -- linear-in-dB signal such as that generated by the linear-in-dB cell of FIG 6, --.

Signed and Sealed this

Fourth Day of May, 2004

JON W. DUDAS
*Acting Director of the United States Patent and Trademark Office*